US011295214B2

(12) United States Patent
Pescarmona

(10) Patent No.: US 11,295,214 B2
(45) Date of Patent: Apr. 5, 2022

(54) ANALYSIS SYSTEM AND HYDROLOGY MANAGEMENT FOR BASIN RIVERS

(71) Applicant: Lucas Pescarmona, Weston, FL (US)

(72) Inventor: Enrique Menotti Pescarmona, Buenos Aires (AR)

(73) Assignee: Lucas Pescarmona, Weston, FL (US)

( * ) Notice: Subject to any disclaimer, the term of this patent is extended or adjusted under 35 U.S.C. 154(b) by 515 days.

(21) Appl. No.: 16/384,156

(22) Filed: Apr. 15, 2019

(65) Prior Publication Data

US 2019/0354873 A1    Nov. 21, 2019

(30) Foreign Application Priority Data

Feb. 16, 2018   (AR) .......................... P20180100382

(51) Int. Cl.
*G06N 5/02*      (2006.01)
*G06N 3/02*      (2006.01)
*G06F 30/28*     (2020.01)

(52) U.S. Cl.
CPC .............. *G06N 5/02* (2013.01); *G06F 30/28* (2020.01); *G06N 3/02* (2013.01); *Y02A 10/40* (2018.01)

(58) Field of Classification Search
CPC ..................................................... G06N 5/02
(Continued)

(56) References Cited

U.S. PATENT DOCUMENTS 6,474,153 B1    11/2002   Yamanaka et al.
6,947,842 B2 *   9/2005   Smith .................... G01W 1/10
                                                                 702/3

(Continued)

FOREIGN PATENT DOCUMENTS

CN     102323970 A    1/2012
CN     106384213 A    2/2017
(Continued)

OTHER PUBLICATIONS

Husain, "Flood routing in reservoir using modified Puls method", International Journal of Science and Research (IJSR), vol. 7, Issue 10, Oct. 2018, pp. 1187-1194.
(Continued)

*Primary Examiner* — Ricky Go
(74) *Attorney, Agent, or Firm* — Leber IP Law; David C. Robertson

(57) ABSTRACT

Watershed hydrology analysis and management process and system with a network of weather stations and artificial drainage systems with artificial and natural reservoir management through locks and pumping stations. It evaluates potential hydrologic risk in each area and analyses the possible consequences of future precipitations using simulations. To make the simulation, it calculates hydrographs for each sub-basin, streams and rivers in the basin. It simulates the behavior of the basin under different scenarios corresponding to different types of management of the operation of locks and/or pumps and compares its results in terms of loss of flooded area, economic loss in each area, loss for flooding of urban areas, etc. Optimization of the simulation through artificial intelligence (AI, meta-heuristic algorithms, neural networks, etc.) allows it to act as a search engine to find better solutions and the best configuration of resource management that allows minimizing the socio-economic impact on each basin.

16 Claims, 7 Drawing Sheets

(58) Field of Classification Search
USPC .......................................................... 702/2
See application file for complete search history.

(56) References Cited

U.S. PATENT DOCUMENTS

| | | | |
|---|---|---|---|
| 7,136,756 | B1 | 11/2006 | Vieux et al. |
| 9,726,782 | B2 | 8/2017 | Cordazzo et al. |
| 2003/0078901 | A1 | 4/2003 | Coppola, Jr. et al. |
| 2004/0138815 | A1* | 7/2004 | Li .............................. E03B 1/00 702/2 |
| 2006/0122794 | A1* | 6/2006 | Sprague ................. G06Q 50/26 702/32 |
| 2007/0143019 | A1 | 6/2007 | Feyen et al. |
| 2013/0317749 | A1* | 11/2013 | Borger .................... G01W 1/10 702/3 |
| 2017/0343702 | A1* | 11/2017 | Radich .................... G01W 1/10 |
| 2018/0165616 | A1* | 6/2018 | Sun ......................... G06F 30/00 |

FOREIGN PATENT DOCUMENTS

| | | |
|---|---|---|
| CN | 107239607 A | 10/2017 |
| CO | 11043550 A2 | 4/2011 |
| JP | H 8-180109 A | 7/1996 |
| JP | 2002038456 A | 2/2002 |
| JP | 2002298063 A | 10/2002 |
| JP | 2004164591 A1 | 6/2004 |
| JP | 2007-524170 A | 8/2007 |
| JP | 4261278 B2 | 4/2009 |
| JP | 2011-154029 A | 8/2011 |
| JP | 2013-517547 A | 5/2013 |
| JP | 2015-4245 A | 1/2015 |
| WO | 2016163129 A1 | 10/2016 |

OTHER PUBLICATIONS

Abbot; et al., "Input selection and optimisation for monthly rainfall forecasting in Queensland, Australia, using artificial neural networks", Atmospheric Research, vol. 138, Mar. 1, 2014, pp. 166-178.

Doycheva; et al., "Assessment and weighting of meteorological ensemble forecast members based on supervised machine learning with application to runoff simulations and flood warning", Advanced Engineering Informatics, vol. 33, Nov. 2016, pp. 427-439.

European Patent Application No. 19157720.4-1111, Intention to Grant dated May 4, 2021, 5 pages.

European Patent Application No. 19157720.4-1111, Search Report dated May 14, 2020, 7 pages.

Fleming; et al., "Development and Operational Testing of a Super-Ensemble Artificial Intelligence Flood-Forecast Model for a Pacific Northwest River", Journal of the American Water Resources Association, Apr. 2015, vol. 51, No. 2, https://doi.org/10.1111/jawr.12259. Disponible en:https://onlinelibrary.wiley.com/doi/abs/10.1111/jawr.12259, pp. 502-512.

Gill, "Flood routing by the Muskingum method", Journal of Hydrology, vol. 36, Issues 3-4, Feb. 1978, pp. 353-363.

Ju; et al., "Division-based rainfall-runoff simulations with BP neural networks and Xinanjiang model", Neurocomputing, vol. 72, Issues 13-15, available on line Apr. 8, 2009, pp. 2873-2883.

Kasiviswanathan; et al., "Methods used for quantifying the prediction uncertainty of artificial neural network based hydrologic models", Stochastic Environmental Research and Risk Assessment, vol. 31, No. 7, Dec. 8, 2016, pp. 1659-1670.

Kavzoglu; et al., "Landslide susceptibility mapping using GIS-based multi-criteria decisoin analysis, support vector machines, and logistic regression", Landslides, vol. 11, No. 13, Jun. 2013, pp. 425-439.

Nourani; et al., "Applications of hybrid wavelet-Artificial Intelligence models in hydrology: A review", Journal of Hydrology, vol. 514, ISSN 0022-1694, Mar. 24, 2014, pp. 358-377.

Patel; et al., "A Comparison of Machine Learning Techniques for Modeling River Flow Time Series: The Case of Upper Cauvery River Basin", Water Resources Management, Springer Netherlands, Dordrecht, Jun. 19, 2014, vol. 9, No. 2. pp 589-602.

Tang; et al., "Assessment of flood susceptible areas using spatially explicit, probabilistic multi-criteria decision analysis", Journal of Hydrology, vol. 558, 2018, Accepted for publication Jan. 12, 2018, ISSN 0022-1694, https://doi.org/10.1016/j.jhydrol.2018.01.033, (https://www.sciencedirect.com/science/article/pii/S0022169418300349), pp. 144-158.

Zaini; et al., "Application of computational intelligence methods in modelling river flow predictions: A review", 2015 International Conference on Computer Communications, and Control Technology, (I4CT), IEEE, Apr. 21-23, 2015, pp. 370-374.

Zhang; et al.; "Short-term water level prediction using different artificial intelligent models", 2016 Fifth International Conference on Agro-geoinformatics (Agro-Geoinformatics), IEEEE, Jul. 18, 2016, 7 pages.

Sivapragasam;et al., "Monthly flow forecast for Mississippi River basin using artificial neural networks", Neural Computing & Applications (2014) 24, published online May 4, 2013, pp. 1785-1793.

Japanese Patent Application No. 2019-025512, English Translation of Decision to Grant A Patent dated Nov. 26, 2021, 2 pages.

\* cited by examiner

ANALYSIS SYSTEM AND HYDROLOGY MANAGEMENT FOR BASIN RIVERS

TECHNICAL FIELD

Analysis system and hydrology management for basin rivers using Artificial Intelligence (AI) for watersheds with networks of weather stations and artificial draining systems with management of natural and artificial reservoirs through locks and pumping stations. This invention combines characteristics from different technical fields such as Meteorology, Hydrology, Engineering, Process Control, Artificial Intelligence and Machine Learning, among other.

BACKGROUND OF THE ART

The existing basic watershed hydrology analysis systems operate analyzing results from atmospheric data, precipitation measurement through rain gages, humidity detectors, etc.; runoff, temperature, solar radiation measurement, and others; which are collected and processed to make predictions manually according to classical calculation techniques.

Data collection is performed by different governmental and private entities that tend to separate meteorological and hydrological data. However, there are cases in which one single entity registers all measured data, whether meteorological or hydrological, as such is the case in the Unites States of America.

These known systems are based on mathematical models that make meteorological and watershed status predictions, usually as described below.

A watershed hydrology analysis system for networks with weather stations according to the current technology uses calculation models, especially the meteorological model and the basin model that is to be analyzed.

Generally, this set of models simulate the three principal processes of a flood event, i.e. precipitation, infiltration, and surface runoff, obtaining in a short time information on flooded areas, flood levels of riverbeds, retained and released volumes; and other significant data. This current technology only receives information and does not remedy the existing problem. That is to say, it does not control the water flows nor does it generate recommendations or coordinate actions or steps to be followed.

Meteorological models are necessary to estimate and extrapolate the precipitation that falls on each of the sub-basins from the data recorded by each rain gage. Meteorological information has two main sources: rain gages that report the quantity of accumulated water in time increments and the output of the meteorological radar. Both sources must be calibrated and adjusted manually in the site in order to obtain a reliable hydrograph output.

Known meteorological models evaluate precipitation over a determined area using the relative positioning of the rain gages that cover such area. These areas are called Thiessen Polygons (the range of each rain gage as half the distance between two consecutive gages).

The isohyets method, on the other hand, determines the lines of equal precipitation level.

Using both results, these known models calculate precipitation level, precipitation distribution over time, and precipitation distribution over a certain area following standard procedures and general recommendations. They provide information on the weather event yet cannot solve problems.

On the other hand, the basin model itself includes an outline of drainage surface, existing connections among different sub-basins, as well as the morphological properties of each sub-basin. This known watershed model also includes chosen calculation methods and their associated hydraulic parameters.

Runoffs are calculated in each sub-basin using the Soil Conservation Service (SCS) method which allows differentiating surface runoff from groundwater flow due to infiltration. Infiltration is a variable that changes according to the terrain characteristics, quantity of absorbed water, vegetation type, etc. Such changes require knowing geophysical characteristics.

A sub-basin hydrograph is obtained from the surface runoff. Each sub-basin has the rainfall to runoff ratio calibrated by the CN (Runoff Curve Number), which is the percentage between 0% and 100% of the absorption of water by the terrain. Also, the CN depends on the humidity conditions preceding the rainfall. There will also be a horizontal contribution from the groundwater flow which is dependent on the slope of the terrain and the porosity of the ground.

Evaporation and evapotranspiration are outflow variables. The former measures water quantity in millimeters over a unit of time of the evaporation that takes place in reservoirs or flooded areas. It is measured by a recording station with evaporation pans. The latter, instead, depends on the type of vegetation or crop, which could be an important strategy in this water balance to decrease the permanence time of flooding waters.

Then, the runoff is estimated, as well as the hydrograph from the sub-basin's surface to riverbeds and streams. Adding the contribution of each sub-basin, the flow to riverbeds and reservoirs can be calculated using generally accepted calculation methods and industry codes.

Possible outflows are also calculated. This is usually performed in known systems using models based on equations such as Chezy/Manning which are inversely related to the Manning coefficient (it depends on terrain roughness/vegetation and takes a value between 0.013 for lined open channels and up to 0.045 for those with vegetation) and directly proportional to the square root of the hydraulic radius of the open channel (calculated as the ratio between surface and wet perimeter) and the channel slope:

$$C = K\left[\frac{R^{0.125}}{n}\right]$$

where,
C=Chezy Roughness Coefficient $$\left[\frac{\sqrt{m}}{s}\right]$$

R=Hydraulic Radius [m]
n=Manning Roughness $$\left[\frac{s}{\sqrt[3]{m}}\right]$$

$$K = \sqrt[3]{m/s}$$

Substituting the roughness calculated with Chezy's equation, Manning's equation is obtained:

$$Q = AR^{\frac{2}{3}}\sqrt{S}$$

where,
Q=Discharge [m³/s]
A=Area [m²]
S=Slope Friction [m/m]

Another variable used in the state of technology analysis system is the natural vertical outflow, which is the terrain seepage. This will depend on the type of terrain and its saturation level given by the phreatic level. The PULS method is used and the MUSKINGUM method relates the hydrograph at the inflow and outflow of each dam and reservoir, surplus flows, maximum levels of each reservoir, dimensions of surplus flow works and determination of the maximum extraordinary water level. In order to do this, the profiles of the natural riverbeds and artificial channels should be known, as well as the reservoirs bathymetric profile, so that the storage capacity and the area to reserved volume ratio can be determined. Therefore, these technology systems mainly depend on the reliability of previously acquired data.

In each part of the current models there are fixed coefficients and other variables that change over time, such as humidity, soil humidity, changes in the coefficient of evapotranspiration due to changes in crops, solar radiation, etc. The model has been set with these variables. Some of these variables are direct or indirect measurements. The current watershed model with many riverbeds and reservoirs may have hundreds of parameters depending on the size of the model's discretization.

A common aspect of the older systems of hydrology analysis is that they require a Control Room. In this Control Room, some data are known, such as water volumes and where surplus volumes should be directed to achieve flood control, but they cannot perform the actions required and, consequently, the problem remains unsolved.

Currently, the tools available generate a reserved forecast that does not have an associated mitigation strategy. They issue warnings on the hydrological problem without intervening in solutions of socio-economic impact. These warnings are distributed to stakeholders and solutions are implemented in isolation without optimizing the resources available in the corresponding watershed. Likewise, there are water management systems that do not have any intelligence associated to the forecasts received. In general, the implementation of an integral system that addresses these multidisciplinary problems would require a significant number of well-trained personnel ready for critical decision-making.

In the state of the technology, the U.S. Pat. No. 9,726,782 B2 Patent is also known. This patent seeks to solve similar problems implementing methods, systems and software storage devices to generate a response to flood events.

In this invention we describe the implementation of two general subsystems. One subsystem is implemented in computers to generate a hydrometeorologic flood prediction with feedback from meteorological information and ground stations data. A second subsystem is used to support decision making. It generates a report with recommendations and feedback on the quality of the measurements from the previous subsystem. As an example, the patent describes the procedure used for detected and validated flood events.

The system can report and execute the following aspects:
Resource location.
Processing of information from the decision-making support subsystem to create a list of recommended actions in case of flood.
Provision of an action list in response to floods that include: communication of the recommendations message to every agent involved in the flood; evacuation of the population; securing of transport routes; securing of critical supplies; isolation of the affected infrastructure; dispatch of qualified personnel and equipment to key locations.
Continuous communication of executed actions and event progress.

However, this antecedent does not explain how the estimates of the hydrometeorological event or the hydrographs are calculated and assessed. Therefore, the method used could have a larger error.

Additionally, this antecedent does not cover the integration of the control of mitigation reservoirs and the integral planning of the watershed, such as floodable areas, higher productivity lots, critical areas, etc. For that purpose, it does not use aerial or satellite imaging to estimate flooded areas, water volumes, soil quality and vegetation information, etc.

In summary, the state of the technology has not yet provided an intelligent system that may operate on-line with the tools of automated learning that might be used to provide feedback for predictions and dynamically adjust the event estimations and hydrologic models, wherein the system's continuous learning could strengthen the decision making of future events depending on the continuous use of the system in order to solve problems quickly and to improve the situation of the population in the areas of implementation.

The technology state has not yet provided a system of hydrologic analysis and management that uses aerial and satellite images and radar to estimate flooded areas, water volumes, soil quality and vegetation information; nor an intelligent system that understands the potential energy generation within an integral plan taking advantage of artificial reservoirs in a distributed and optimized way with electrical pumps and pump-turbines.

SUMMARY OF THE INVENTION

This invention aims to provide a hydrological analysis and management system and process for watersheds with meteorological networks and artificial drainage systems with natural and artificial reservoir management by means of locks and pumping stations where the potential hydrological risk of each area is evaluated and the consequences of future precipitations are analyzed beforehand using simulations carried out using an Artificial Intelligence system where hydrographs for each sub-basin, streams and riverbeds within the basin at hand are calculated for each simulation and, afterwards, the behavior of the basin under different scenarios corresponding to different management of locks and/or pumps operations is simulated and the results compared against the surface loss due to flooded area, economic loss for each sector, losses due to flooding of urban areas, etc.; where the simulation optimization through Artificial Intelligence (meta-heuristic algorithms, neural networks, etc.) becomes the search engine to look for the best possible solutions and the best configuration of resource management to allow minimization of socio-economic impact within the watershed facing the hydrologic event.

Another goal of this invention is to supply a hydrology analysis and management system whose resolution comprises a mass balance created by the incoming and outgoing volumes that allows retaining such volume in each study cell into which the system is divided where said water volumes can be directed to a certain destination in order to achieve flood control in accordance with the selected protection criteria through a control room and decision-making process in which all information is quickly obtained and available on-line and from which the opening and closing of locks and operation of the available pumping stations for drainage control can be directed orderly.

Another goal of this invention is to provide a watershed hydrology analysis and management system process within which strategies could be formulated using Artificial Intelligence to protect villages and towns, the best productive areas, the best soils, and the strategic locations for watersheds thereby allowing water storage in unused land for the purpose of using it later in response to future drought and facilitating an important strategic byproduct as is the generation of electricity using advanced conversion systems (low-speed generators and run-of-the-river turbines) through the management of available water resources.

DETAILED DESCRIPTION OF THE INVENTION

Figure 1:
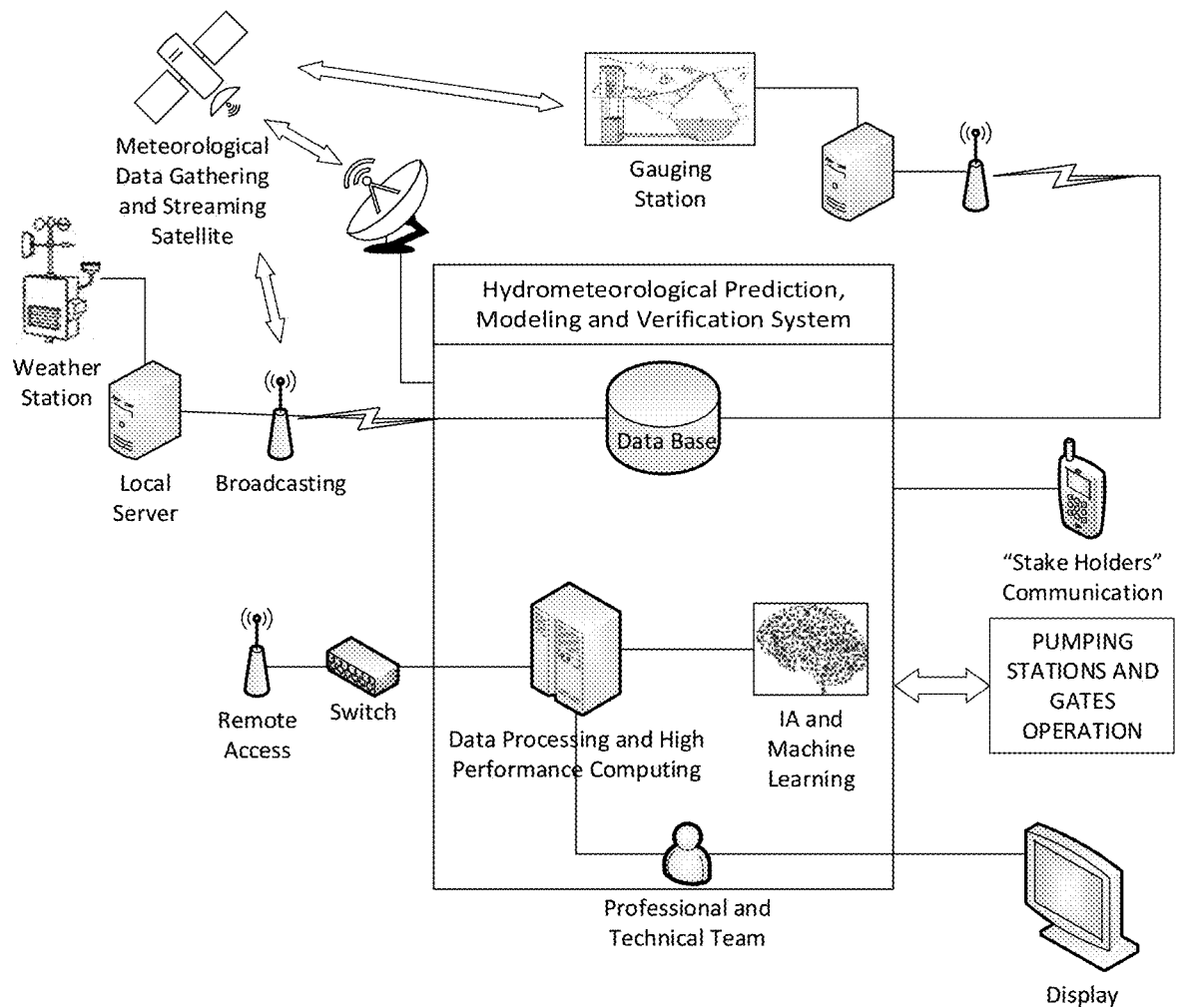
FIG. 1 is a basic schematic of the invention mainly showing collection and data management.

The invention, in its preferred mode of implementation, entails a process and system of hydrology analysis and management using Artificial Intelligence (AI) for watersheds with networks of weather stations and artificial drainage systems with administration of natural and artificial reservoirs through locks and pumping stations that offer a real-time response to the problem during its occurrence, thereby optimizing flood control in the watershed to which the invention is applied. The term 'real time' should be understood as the response time of the system within the magnitude of the timing of the development of the meteorological phenomenon.

Both the process and the system combine means from several disciplines. Through the analysis of meteorologic events and their hydrologic consequences, an integral hydrologic model that is capable of describing the hydrologic state of the watershed as well as predicting runoffs, flooding and drought, is trained. This model, composed of a large number of multi-parameter equations, calculates scenarios on the hydrologic state of the watershed for different weather forecasts. In this way, a large number of cases can be prepared before said forecast. Based on the occurrence of a certain meteorological event, the system automatically selects the calculated case that best describes measurements. Therefore, hydrologic prediction is available in a few hours.

The training of the assumed scenario results in watershed behavior curves. These curves are the system's transfer function (TF) between input (rain and actual state of the watershed) and output (scenario after the rain). It is a non-linear function that depends on hundreds of factors. Some of them are stochastic factors while others are deterministic factors that change depending on time, humidity, climate conditions, temperature, etc.

$$\text{BEHAVIOR CURVE} = f(\Sigma H, \Sigma E, \Sigma A, fNR \dots)$$

The behavior curve is a complex linkage of hydrographs $H=f$ (surface, DEM, soil structures, etc.), runoffs $E=f$ (H, infiltration, soil humidity, etc.), and avenues $A=f$ (E, bathymetric profile), reservoir levels $NR=f$ (volume, inflow, outflow, evaporation) of each of the sub-basins, gauging, reserves and basins of the watershed; that is why the training of the expected scenario creates hundreds of curves.

In this way, when an event similar to the expected rain scenario takes place, the system instantaneously recognizes the expected behavior of the watershed. The hydrology analysis and management system is set to generate an early alert and warn the community. The information to be delivered will depend on the predictive conditions of each location in the watershed. It will be delivered to the stake holders by means of automated applications through mobile phones, electronic mail and smart or similar apps, together with a reservoir management control plan that may determine, as an example, to pump water from one sub-basin to the other.

While this is taking place, the operating state of the drainage system provides feedback to the expert system using the ground measuring stations, which continuously reclassify the analysis conditions in order to maintain the watershed mass balance through a set of sensors, instruments and computers which have a closed-loop communication system, i.e., pumping or closing/opening locks to direct water from one reservoir to the other.

Over time, databases are filled with additional information, trends and watershed behavior curves for different precipitation scenarios. Additionally, each behavior curve is calibrated with the variables of each sub-basin models. These parameters change over time, such as soil structure, crops, temperature, humidity, etc. This growing database feeds the systems assisted by AI to anticipate the system of deterministic and stochastic events.

Figure 4:
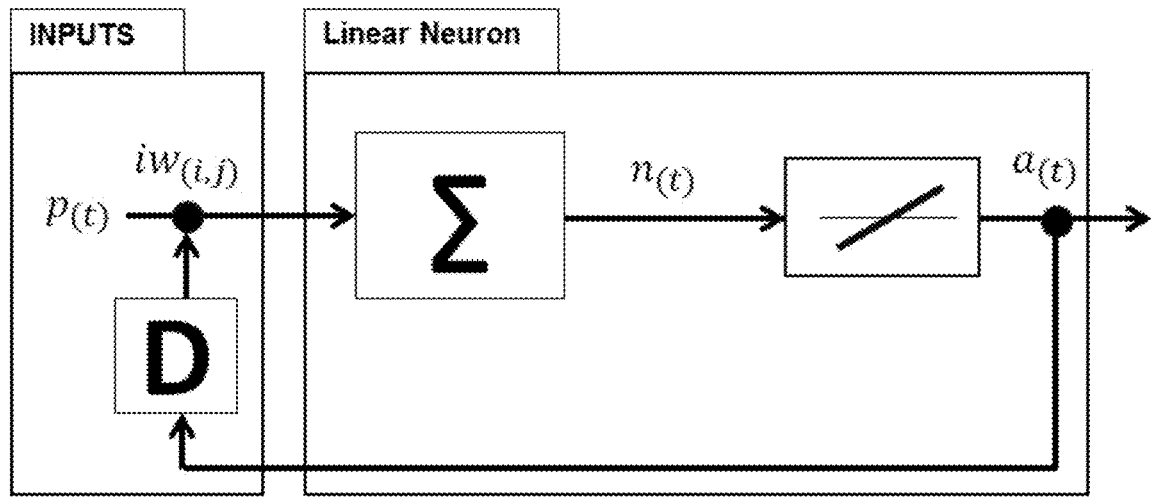
FIG. 4 represents a Lineal Recurrent Neural Network.
Figure 5:
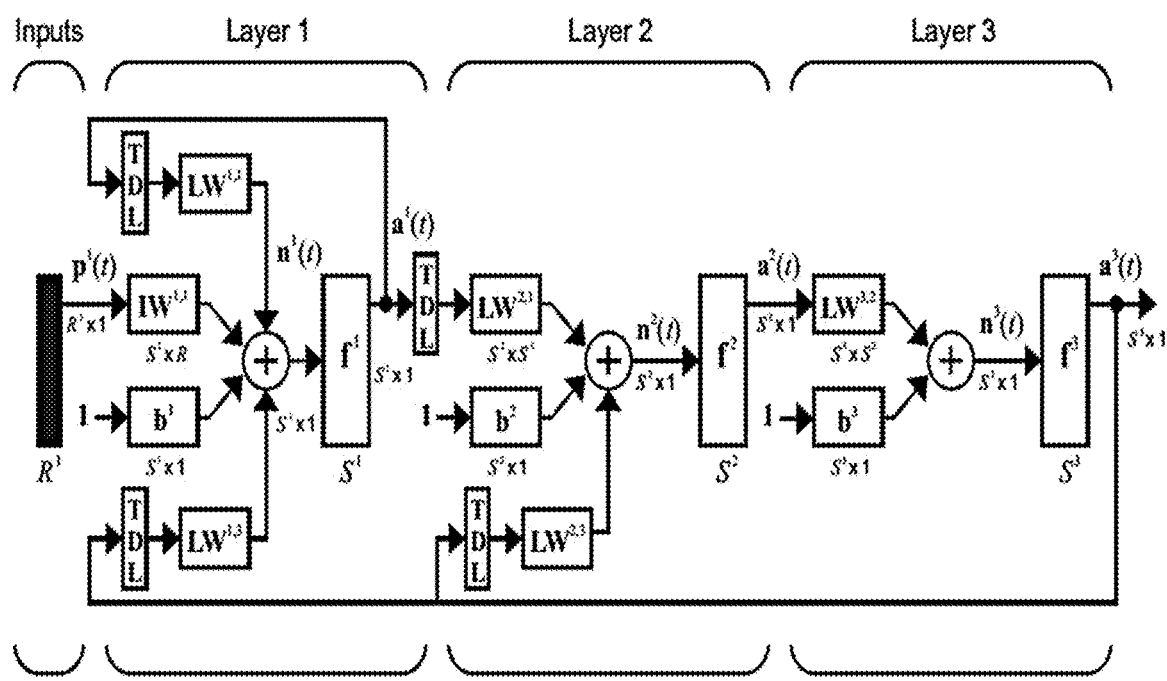
FIG. 5 shows a three-layer LDDN network.
Figure 6:
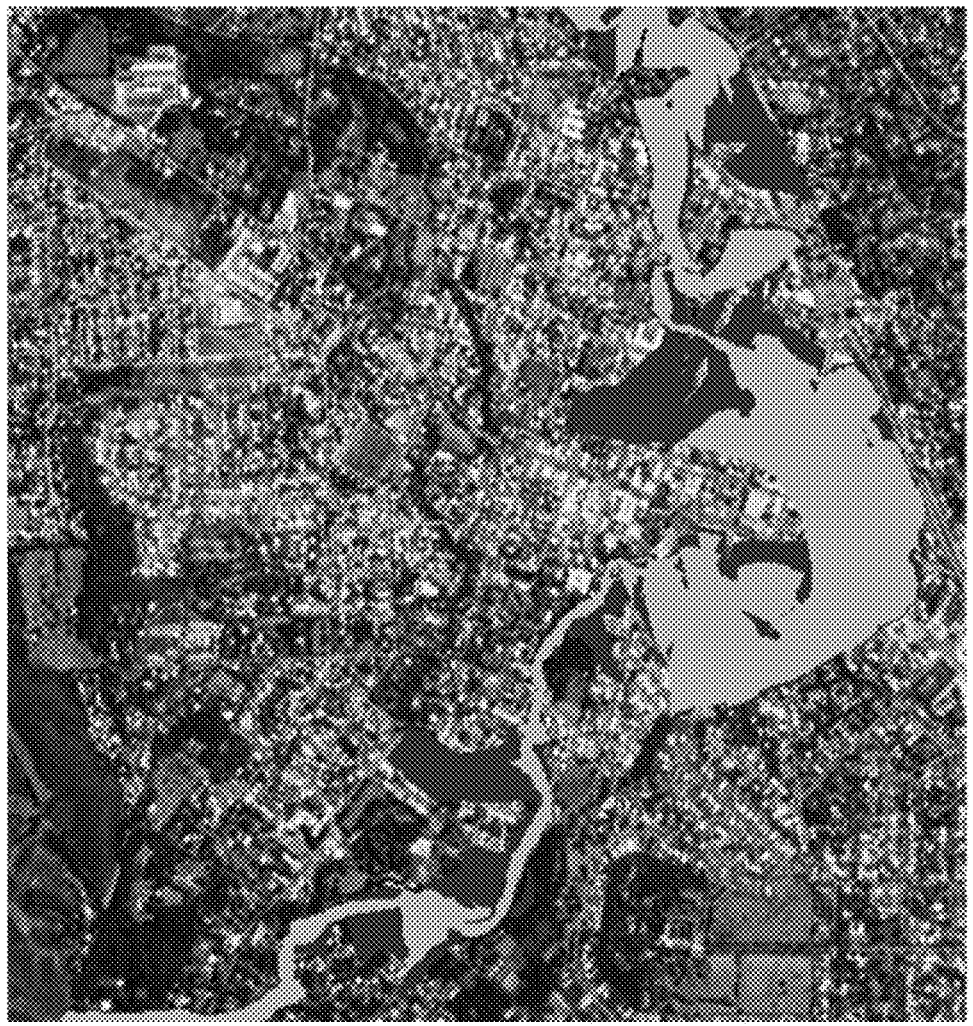
FIG. 6 is an example of a flooding map as a result of the forecast of the artificial neural network.

The model is calibrated continuously from each sub-basin in particular and its surroundings using adjustment algorithms through adaptive filters with measured data as depicted in FIGS. 4 and 5, which will be described in more detail below.

Given that this is an AI and Machine Learning system, the response time and accuracy of the results improve through use and learning as more experience is acquired.

Figure 2:
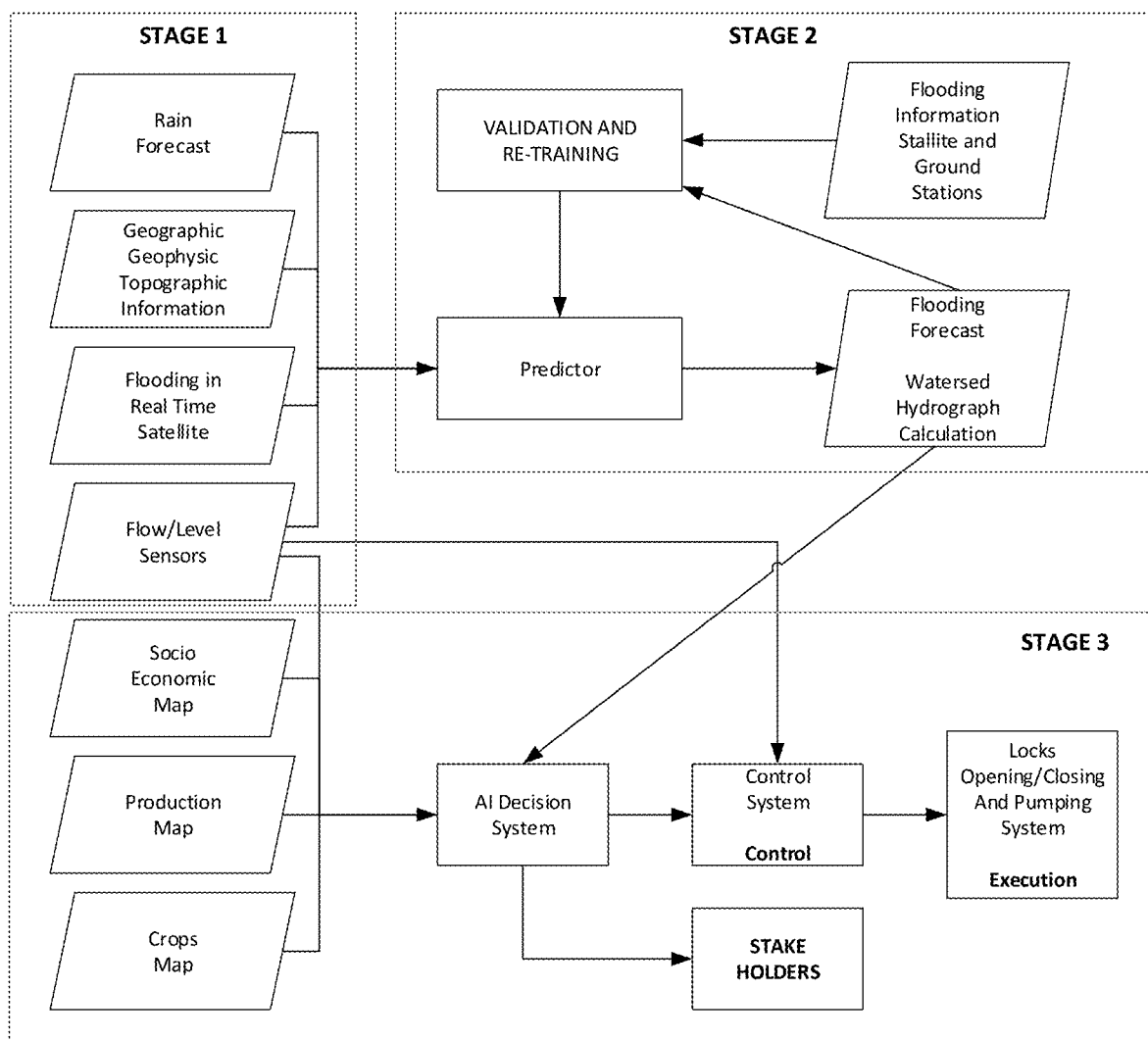
FIG. 2 is a simplified flow diagram showing the different stages of the asserted process.

The process of hydrology analysis and management in its preferred execution consists of three fundamental stages for its development, as it is shown in the simplified diagram in FIG. 2.

The first stage involves the measurement and survey of historical data; in the second stage we differentiate among predictive systems using machine learning methods and hydrology modeling. These predictions need to be validated using the information gathered by the streams flow and reservoir levels monitoring stations. The third stage creates mitigation strategies to minimize the impact of the meteorological event on the basis of the information gathered by the predictive sub-module and its continuous validation, added to the watershed productive socio-economic data, all dynamically gathered.

There follows a detailed description of each one of the stages based on the preferred mode of execution of the invention.

This first stage of the process measures and surveys historical data, such as the description of the watershed, emphasizing the logistics of data management and monitoring stations distribution. Continuous support must guarantee the on-line operation of this first stage, which feeds subsequent ones, reason why its importance in the collective operation of the process is essential. A schematic of this first stage is shown in FIG. 1.

Weather stations with data acquisition and on-line data transmission capabilities through satellite which communicate with the Acquisition Center and Database arranged in the watershed and in areas that contribute to it. Some of the sensors involved in the system are:

Sensor 1: Rain gage.
Sensor 2: Evapotranspiration sensor.
Sensor 3: Wind velocity.
Sensor 4: Atmospheric and soil humidity.
Sensor 5: Temperature.
Sensor 6: Flowmeters in rivers and streams.
Sensor 7: Water level of pondage, dams, rivers and streams.
Sensor 8: Infiltration and seepage.

Another input to the database is satellite information, which is obtained through a tool with automatic access to the server or database of the entity that provides the service. These satellite data are used to visualize the overall watershed state, to estimate flooded areas, drought areas, and tracing and description of storms. They also allow classifying crops to estimate the degree of water consumption based on their characteristics.

Some satellite data are images. Two types of satellite images can be used:

SAR (Synthetic Aperture Radar) images: to monitor a flooded area, and

RGB and Multispectral images: to calculate the green index, crop classification, etc.

In the second stage of the process of hydrology analysis and management, according to the preferred mode of execution of the invention, we differentiate among predictive systems using machine learning methods and hydrology modelling. Predictions are validated by the information gathered on riverbeds flow and reservoir levels by monitoring stations.

Figure 3:
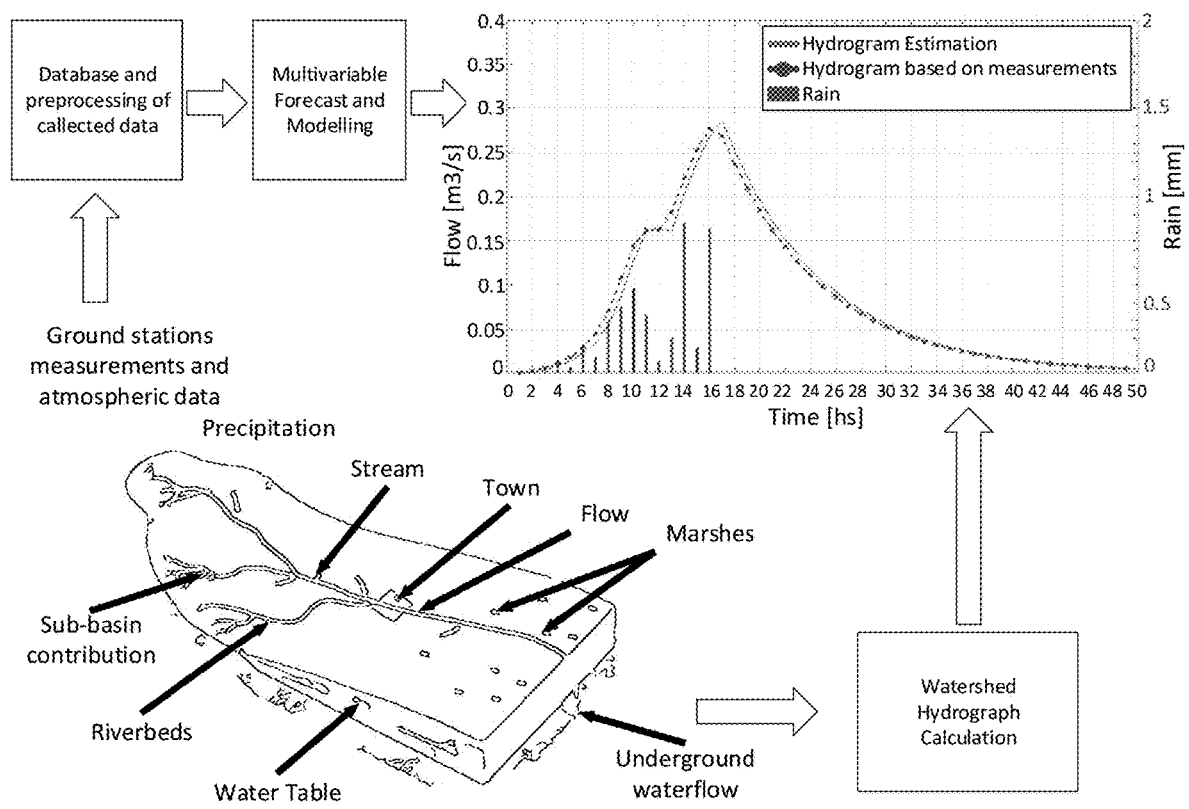
FIG. 3 depicts a simplified scheme of hydrograph generation as input variables to the management subsystem.

In this second stage of the process, as depicted in FIG. 3, the operation of the predictive module or predictor is fundamental.

The predictive module entails training a dynamic Artificial Neural Network to generate predictions of possible flooded areas. This type of networks of recurrent topology use the pre-processed data gathered on ground stations, satellites, radars, and information from distributed meteorological systems, as well as the predictions of the network performed in prior cases. Dynamic networks are usually more powerful than static networks (which have a higher degree of difficulty regarding training). Since they have memory, dynamic networks can be trained to learn sequential patterns or time variations. This characteristic can be applied to different areas, such as financial markets predictions, communication channels equalization, phase detection in power systems, failure detection, language recognition and meteorological prediction, among others.

To predict a temporal pattern, an artificial neural network requires two distinctive components: a memory and a combiner.

The memory is generated by a delayed time unit (shift register) which constitutes the tapped delay line (TDL) and stores past relevant information used to improve predictions.

The combiner will be, for example, a multi-layered perceptron-type network efficient for static, complex and non-linear mapping. A network topology that complies with the above is called Layered Digital Dynamic Network (LDDN). Each layer of this network is composed of the following parts:

A set of synaptic weight matrices that enter the layer (which can interconnect from other layers or external inputs), combination rules for the weighted functions used to combine the weight matrices with the inputs and associated TDL.

An influence-bias vector.

Rules for the network input functions used to combine the weighted functions outputs with the bias vector to generate the input to the network, and A transfer function.

An example of an LDDN multilayered network can be seen, as shown in FIG. 5, where a structure of a three-layered network is shown, where the variable LW means the weight on the hidden layers, IW is the weight on the input layer, B represents the bias unit and f is the transfer function among layers.

Therefore, as many networks as areas in which a forecast is desired will be required. Each network must be trained with variables available of the area and with the previously surveyed data, determining the existence or not of flooded land along with its level of water.

The training of this type of networks requires personnel highly knowledgeable in hydrology, neural networks, machine learning, information systems and related sciences such as geology, topology, mechanics, electronics and communications, among others. It will also require a large number of computers interconnected in a vector array that allow knowing in a short time and through this analysis the best solutions with the least socio-economic impact in order to make the most convenient decision.

A thorough analysis should be performed to determine the best parameters to improve the classification and forecast. This work can be optimized through parallel computing methods. For each analyzed instant, a map with the flooding forecast is obtained, as shown in. The general predictor output will then be a mapping of the basin with the flooding forecast. This outcome will be used to calculate the basin hydrograph, taking also into account its topographic data. The calculated flows will be validated and this information will be fed back to the entire chain with the flow measurement points in all key areas of the basin. In this manner, the model and the forecast network will be continuously updated to improve its predictions.

The use of complex computational physical models of the basin's dynamic behavior serves as a training tool for the predictive system. The multi-variable model optimized with the collected experience allows the training of the predictor on cases not previously registered, allowing a fast response time due to the quick processing of the neural networks. In this way, the integral predictive tool includes the computing times of the physical model and of the network self-training.

Finally, in the third stage of the hydrology analysis and management process, according to the preferred mode of execution of the invention, mitigation strategies are generated to minimize the impact of the meteorological event depending on the information collected by the predictive submodule and its constant validation, added to the basin's socioeconomic productive data, dynamically gathered.

The evaluation software is based on a Geographical Information System (GIS) that uses as input the outcome of the flooding forecast geographically divided in cells. Each cell has the information of the water level in each evaluation area. In this way, the event is analyzed in layers (rasters), which when considered together, identify the problem areas and possible areas where actuation maneuvers can be performed.

The evaluation layers of each cell have an incidence weight value. For example, if the layer represents population density, the agricultural area weight value will be close to zero, while the urban one will be much higher.

Figure 7:
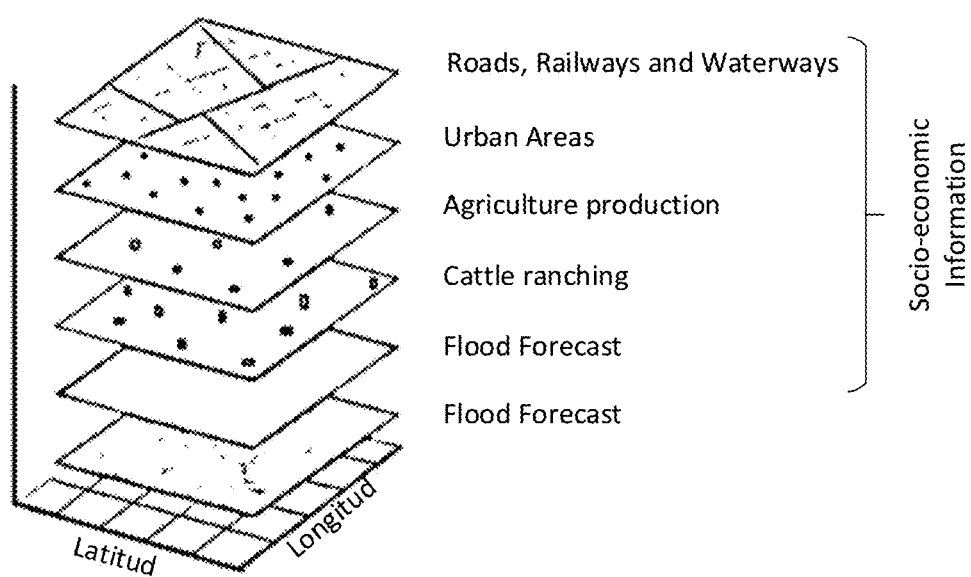
FIG. 7 is a layered input to the decision-making system assisted by Artificial Intelligence.
Figure 8:
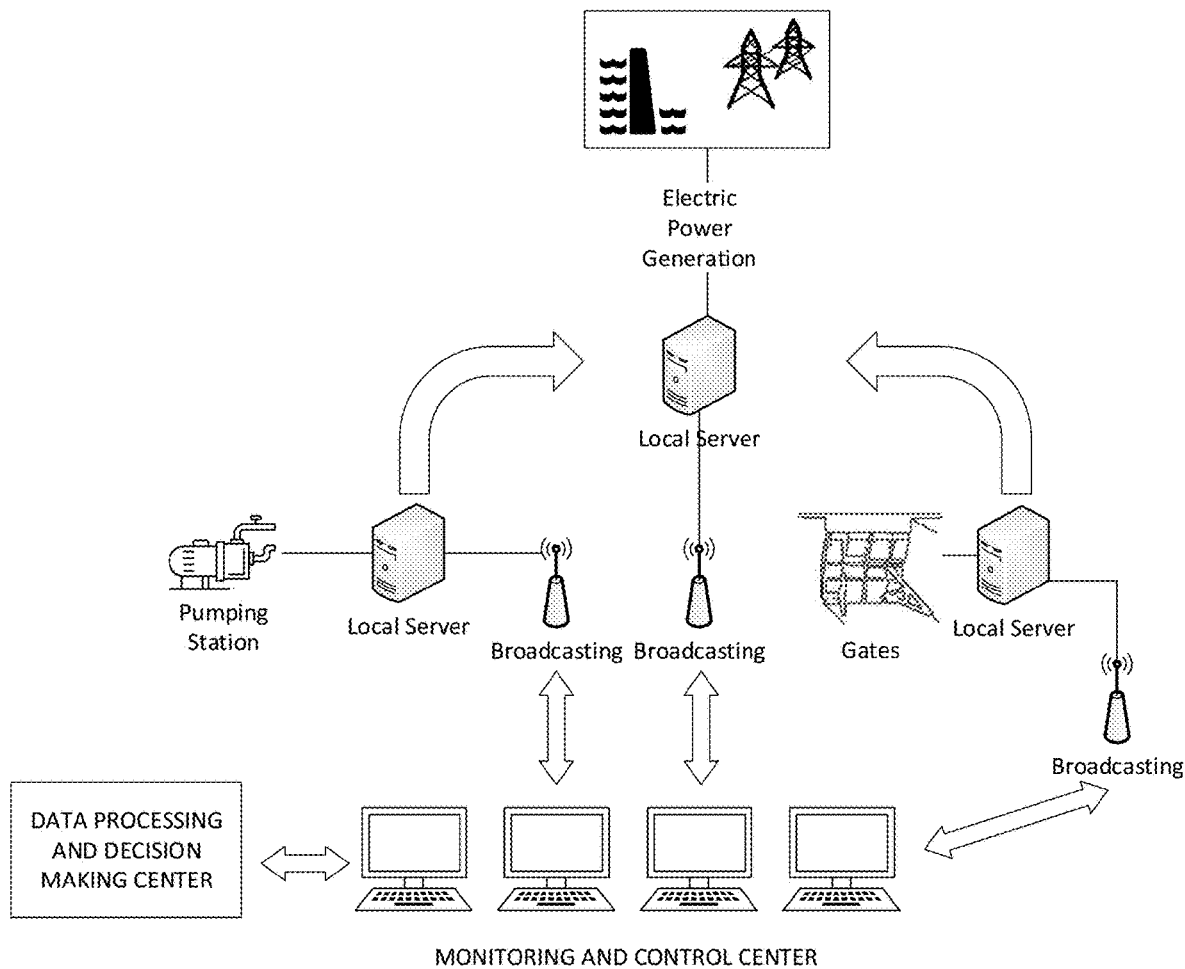
FIG. 8 represents a structure that reveals the stages and combination of means for water volume management based on the asserted invention.

Additionally, and depending on the incidence of the weight that each layer may have, it will be the relevance that will be given in the event. For example, if less weight is given to cattle ranching instead of agricultural activity, the system will tend to flood the agricultural area, starting on the assumption that it is easier to move the cattle to a higher area rather than crops. An example of this analysis in layers is shown in FIG. 7.

In this manner, each layer will be weighed by a coefficient related to socio-economic priorities.

The AI-assisted decision module with Multi-Criteria Decision Analysis (MCDA) vector optimization algorithms is in charge of finding flooding areas that minimize socio-economic impacts on the basin. This decision module includes a multitasking distributed computer center.

This results in a unique raster with water levels derived from the combination of all other input layers. With this result, the decision module performs the simulation of the operation of locks and pumps needed for the basin to achieve the required state within a determined timeframe.

Once it has been determined which water volumes are to be moved and where, the operation report is generated in a control room from where the actuation of the locks and pumping stations available for drainage control are executed and monitored in order to achieve flood control in accordance with the protection criteria chosen.

The control room follows a normalized standard based on international safety and reliability standards for man-machine interface. In the preferred mode of execution, the control room includes three sectors to be determined depending on the application, but always keeping with the strictest safety standards.

One sector is the supply of normal line energy and backup energy or uninterrupted support to the battery pack. The second sector is the air-conditioning equipment room for environment adjustment depending on the equipment used and the local conditions; and the third sector includes two parts: the system operation room, which is subdivided into visualization and on-line calculations (algorithmic and modelled) and the server room, which includes the communication system.

In said control and decision-making room, all information will be available on line in order to make decisions quickly.

In this way, strategies will be generated to:
Protect urban areas.
Protect the most productive areas.
Protect the best soils, the most productive areas and strategic locations of the basin.
Store water in non-productive areas in order to use it for irrigation purposes in future droughts.

An additional advantage of this invention when comparing it with previously-known applications is that the management of available hydrological resources allows obtaining a strategically important byproduct, i.e. electrical generation, using, as an example, advanced converter systems such as low speed generators and run-of-the-river turbines.

The resolution of the process launched by the system based on the preferred mode of execution of the invention consists in the analysis of a mass balance originated by the inflow, outflow, and pondage in each study cell into which the system is divided. Thus, in each cell's domain, the system solves the following equation:

$$V_I^i V_E^i + V_R^i$$

where,
i is the cell number that corresponds to the adopted subdivision of the system
$V_I^i$ is the incoming volume in each cell i
$V_E^i$ is the outgoing volume in each cell i
$V_R^i$ is the pondage or retained volume in each cell i The choice of number and surface of each study cell is defined as a function of the accuracy needed for the variables to be determined in each sector of the system. Therefore, each system will be divided in larger or smaller cells depending on the economic, social, and environmental importance of each study area.

The incoming volume $V_I^i$ is determined by vertical and horizontal contributions. The main vertical contribution$_E$ is precipitation, while the horizontal one corresponds to the outgoing volume $V^{i+n}$ of the adjacent cells, which is originated by surface horizontal runoff and groundwater flow.

Therefore, $$V_I^i = V_{IP} + V t_{ES}^{i+n} V_{RSU}^{i+n}$$

where,
$V_{IP}$ is the incoming flow due to precipitation
$V_{ES}^{i+n}$ is the superficial volume that enters study cell "i" incoming from cell
"i+n" adjacent to the one under study
$V_{RSU}^{i+n}$ is the groundflow water that enters study cell "i" incoming from cell "i+n" adjacent to the one under study The outgoing volume $V_{ES}^{i+n}$ of each cell originates in outgoing volumes both vertically and horizontally.

The vertical volumes are those originated by the evaporation of liquid surfaces due to solar radiation and temperature (mm/time), evapotranspiration (depending on natural vegetation or crops), and infiltration (which is variable depending on the type of soil and degree of saturation and water table level of the existing lot in each study cell).

On the other hand, the horizontal volumes are determined by the outgoing volume within a certain period of time (flow) that can be transferred towards adjacent cells through natural or artificial channels.

The difference between incoming $V_I^i$ volume and outgoing $V_E^i$ volume of each cell can either be positive or negative. If it is positive, i.e. the incoming volume is larger than the outgoing volume, it creates a pondage or retained volume $V_R^i$ in the study cell, which can be stored or dammed in a controlled manner through natural or artificial reservoirs or in an uncontrolled manner, producing undesired flooding in areas of the cell.

The stored volume can be slowly reduced by releases from artificial reservoirs, i.e. by opening locks and discharge valves or through pump stations located in natural reservoirs for that purpose, thereby distributing along time the outflow of each cell for the purpose of relieving or avoiding flooding in cells located downstream.

If the difference is negative, i.e. the outgoing volume $V_E^i$ is larger than the incoming volume $V_I^i$ during times of scarce precipitation, the volume stored in natural and artificial reservoirs, both on the surface and underground, can be used to try to stabilize the equation and ameliorate periods of drought. Management of the water volumes in the different reservoirs is achieved by operating available pumps and locks interconnected in the basin.

The above description includes examples of one or more means of operation. Obviously, each of the combinations of possible components or methodologies cannot be described for the purpose of explaining the execution previously addressed, but a properly trained person can recognize that many other operational combinations and permutations are possible. Thus, the manner of operation described is destined to encompass all the alterations, modifications and variations that lie within the scope of the assertions that follow.

The invention claimed is:

1. A method for hydrological analysis and management of river basin, the method comprising the steps of:
   measuring and surveying historical data of existing weather stations previously installed and distributed throughout the river basin, the weather stations including sensors, data acquisition devices, and transmission systems capable of transmitting data on-line to a data acquisition center and data base;
   predicting behavior of the basin towards a meteorological event through a predictive module device that includes a dynamic artificial neural network trained to generate predictions depending on data pre-processed and collected from the weather stations and the neural network's own predictions;
   creating and providing mitigation strategies to minimize impact of the meteorological event on the basis of the collected information, where the creation of the mitigation strategies includes:
   evaluating data through a geographical information system that divides the area under evaluation into cells based on the flooding forecast and information of water level present in such area;
   analyzing the event through superimposed layers with different incidence weighing values for each of them determined by socio-economic information;
   obtaining a single layer with water levels derived from the superimposition of remaining layers analyzed that minimize the socio-economic impact on the basin through an artificial intelligence assisted decision-making module with multi-criteria decision analysis vectorial optimization algorithms; and
   simulating the operation of locks and pumps needed for the basin to achieve the required state within a certain period of time setting water volumes that should be released and their direction to control flooding in accordance with the protective criteria selected;
   wherein the step of provision of mitigation strategies includes:
   preparing the operating report and sending it online to a control room from where the actuation of the locks and pumping stations available for drainage control is directed and executed.

2. The method according to claim 1, wherein the step of measuring and surveying the historical data is implemented by using rain gauges, evapotranspiration gauges, wind speed sensors, ambient and soil humidity sensors, temperature sensors, flowmeters in rivers and streams, water level in ponds, reservoirs, rivers and streams, and infiltration and percolation sensors installed in the weather stations.

3. The method according to claim 1, wherein the step of measuring and surveying the historical data is implemented through satellite images that allow viewing the state of the entire watershed.

4. The method according to claim 1, wherein the step of predicting behavior of the basin towards a meteorological event includes the prior step of training a dynamic neural network of the predictive module to learn sequential or time variable patterns that includes at least one memory and one combiner.

5. The method according to claim 1, wherein the step of predicts the behavior of the basin in response to a meteorological event includes a basin mapping with flooding forecast through the predictive module and, afterwards, calculates the hydrograph of the basin under study using topographical data; and
   validates calculated flows and feeds the entire chain with flow measuring points in key areas in order to update the predictive model and the network permanently to improve future predictions.

6. The method according to claim 1, wherein the step of creating and providing mitigation strategies includes:
   evaluation of data through a geographical information system that divides area under evaluation into cells based on the flooding forecast and the information of water level present in that area;
   analyzing of the event through superimposed layers with different incidence weighing values for each of them determined by socio-economic information;
   achieving a single layer with water levels derived from the superimposition of remaining analyzed layers that minimize the socio-economic impact on the basin through an assisted decision-making module with multi-criteria decision analysis vectorial optimization algorithms; and
   simulating of the operation of locks and pumps needed for the basin to achieve the required state in a certain period of time determining water volumes that should be released and their direction to control flooding based on selected protection criteria, and
   wherein the supply of such mitigation strategies includes:
   preparing the operating report sending it online to a control room from where the actuation of the locks and pumping stations available for drainage control is directed and executed.

7. The method according to claim 1, wherein the step of creating and providing mitigation strategies includes:
   analyzing a mass balance originated by the incoming volume of water, outflowing volume, and pondage in each study cell into which the evaluation area has been subdivided, where the domain of each of the cells is solved using the following equation:

$$V_I^i = V_E^i + V_R^i$$

where i is the cell number that corresponds to the adopted subdivision of the system; $V_I^i$ is the incoming volume in each cell i; $V_E^i$ is the outgoing volume in each cell i; and $V_R^i$ is the pondage or retained volume in each cell i.

8. The method according to claim 7, wherein the incoming volume is calculated using the following equation:

$$V_I^i = V_{IP} + V_{ES}^{i+n} + V_{RSU}^{i+n}$$

wherein $V_{IP}$ is the incoming flow due to precipitation; $V_{ES}^{i+n}$ is the superficial volume that enters study cell i incoming from cell i+n adjacent to the one under study; and $V_{RSU}^{i+n}$ is the groundflow water that enters study cell i incoming from cell i+n adjacent to the one under study.

9. The method according to claim 7, wherein the outgoing volume $V_E^i$ of each cell originates in outgoing volumes both vertically and horizontally, in which the vertical volumes are those originated by the evaporation of liquid surfaces due to solar radiation and temperature, evapotranspiration and infiltration; while the horizontal volumes are determined by the outgoing volumes possible of being directed to adjacent cells through natural or artificial channels and within a certain period of time.

10. The method according to claim 1, wherein the management of available hydrological resources allows generating electricity using advanced converter systems such as low speed generators and run-of-the-river turbines.

11. An analysis system and hydrology management for river basins comprising:
    a plurality of weather stations distributed throughout the river basin, the weather stations acquire data and a satellite online data transmission system that communicates with an acquisition and database center;
    a predictive module that includes a dynamic artificial neural network trained to generate predictions about possible flooding areas through a pre-processed data collected previously where said prediction is conformed as a mode of basin mapping;
    an evaluation computer device configured to:
        receive the mapping generated by the predictive module
        divide the evaluation area in cells, where each cell contains information on water level in each area under evaluation;
        analyze the event as superimposed layers with different incidence weight values,
        each of them determined by socio-economic information,
    an assisted decision-making module with multi-criteria decision analysis vector optimization algorithms configured to:
        find the flooding areas that minimize the socio-economic impact on the river basin;
        define a single layer with water levels derived from the superimposition of the rest of the input layers; and
        simulate the operation of the locks and pumps needed for the basin to achieve the required state within the period of time defined previously; and
    a control room equipped with permanent power supply devices, communication system servers, and a series of computers configured to make all the information available online, to generate the operating report, and to execute and direct the operation of locks and pumping stations available for drainage control, and
    a plurality of locks and pumping stations distributed throughout the river basin.

12. The system according to claim 11, wherein the weather stations include at least rain gauges, evapotranspiration gauges, wind speed sensors, ambient and soil humidity sensors, temperature sensors, flowmeters in rivers and streams, water level in ponds, reservoirs, rivers and streams, and infiltration and percolation sensors installed in weather stations.

13. The system according to claim 11, wherein the predictive module with the dynamic artificial neural network includes a memory and a combiner, where said memory is generated by a unit of delayed time which constitutes the tapped delay line and stores past relevant information used to improve predictions, wherein the combiner is a perceptron-type multi-layered network.

14. The system according to claim 11, wherein the network layer includes at least one set of synaptic weight matrices that enter the layer, combination rules for the weighted functions used to combine the weight matrices with the inputs and associated tapped delay line, an influence-bias vector, rules for the network input functions used to combine the weighted functions outputs with the bias vector to generate the input to the network, and a transfer function.

15. The system according to claim 11, wherein the predictive module is configured to be trained through a multi-variable model.

16. The system according to claim 11, wherein the assisted decision-making module includes a multitasking distributed computing center.

* * * * *